(12) United States Patent
Hammerschmidt

(10) Patent No.: US 10,895,512 B2
(45) Date of Patent: Jan. 19, 2021

(54) PRESSURE MEASURING ARRANGEMENT INCLUDING TWO PRESSURE MEASUREMENT SENSORS ON A CARRIER

(71) Applicant: Infineon Technologies AG, Neubiberg (DE)

(72) Inventor: Dirk Hammerschmidt, Finkenstein (AT)

(73) Assignee: Infineon Technologies AG

( * ) Notice: Subject to any disclaimer, the term of this patent is extended or adjusted under 35 U.S.C. 154(b) by 123 days.

(21) Appl. No.: 16/213,543

(22) Filed: Dec. 7, 2018

(65) Prior Publication Data
US 2019/0178740 A1 Jun. 13, 2019

(30) Foreign Application Priority Data
Dec. 11, 2017 (DE) .......... 10 2017 129 442

(51) Int. Cl.
*G01L 19/00* (2006.01)
*G01L 13/00* (2006.01)

(52) U.S. Cl.
CPC .......... *G01L 19/0038* (2013.01); *G01L 13/00* (2013.01); *G01L 19/0046* (2013.01)

(58) Field of Classification Search
CPC ..... G01L 19/147; G01L 9/0042; G01L 19/04; G01L 9/0054; G01L 9/0072; G01L 13/025; G01L 19/14; G01L 19/0038; G01L 19/0084; G01L 9/0055; G01L 9/0075; G01L 19/0069; G01L 9/0052; G01L 9/0073; G01L 19/0092; G01L 19/0618; G01L 19/0645; G01L 19/143; G01L 9/0051; G01L 19/0007; G01L 19/0046; G01L 19/06; G01L 19/0627; G01L 19/0681; G01L 27/002; G01L 9/00; G01L 9/0041; G01L 9/0044; G01L 11/025; G01L 11/04; G01L 19/0023; G01L 19/0672; G01L 19/069; G01L 19/142; G01L 19/145; G01L 19/16; G01L 7/00; G01L 9/0047; G01L 9/06; G01L 9/065; G01L 9/12; G01L 11/02; G01L 13/00; G01L 15/00; G01L 19/0015; G01L 19/003; G01L 19/02; G01L 19/0609; G01L 19/083; G01L 19/10;
(Continued)

(56) References Cited

U.S. PATENT DOCUMENTS 10,015,600 B2 * 7/2018 Pahl .................. H04R 1/04
2007/0290364 A1 * 12/2007 Gupta .................. H01L 23/498
257/777
(Continued)

FOREIGN PATENT DOCUMENTS

DE 102009034577 A1 3/2010
DE 102010006132 A1 8/2011
(Continued)

*Primary Examiner* — Andre J Allen
(74) *Attorney, Agent, or Firm* — Design IP (57) ABSTRACT

A pressure measuring arrangement is proposed. The pressure measuring arrangement includes a first MEMS pressure sensor arranged on a carrier, and also a second MEMS pressure sensor arranged on the carrier. Furthermore, the pressure measuring arrangement includes an integrated circuit arranged on the carrier, the integrated circuit being coupled to the first MEMS pressure sensor and the second MEMS pressure sensor.

21 Claims, 10 Drawing Sheets

(58) Field of Classification Search
CPC ....... G01L 19/148; G01L 27/005; G01L 7/08; G01L 7/082; G01L 7/163; G01L 7/166; G01L 9/0045; G01L 9/0048; G01L 9/006; G01L 9/007; G01L 9/0076; G01L 9/04; G01L 9/045; G01L 9/125; G01L 11/00; G01L 17/00; G01L 19/00; G01L 19/0076; G01L 19/08; G01L 19/141; G01L 19/146; G01L 1/142; G01L 1/2262; G01L 1/246; G01L 21/12; G01L 23/16; G01L 27/007; G01L 7/04; G01L 7/063; G01L 7/084; G01L 7/086; G01L 7/16; G01L 9/0002; G01L 9/0007; G01L 9/0016; G01L 9/0019; G01L 9/0022; G01L 9/0027; G01L 9/0033; G01L 9/0039; G01L 9/005; G01L 9/0058; G01L 9/0077; G01L 9/0079; G01L 9/008; G01L 9/0092; G01L 9/0095; G01L 9/025; G01L 9/08; G01L 9/085; G01L 9/105; G01L 9/14; G01L 9/16; H01L 2224/48091; H01L 2924/00014; H01L 2224/48137; H01L 2224/48145; H01L 2224/73265; H01L 2924/00012; H01L 2224/04105; H01L 2224/24137; H01L 2224/49175; H01L 24/19; H01L 2924/1461; H01L 2924/1815; H01L 2924/18162; H01L 29/84; H01L 41/047; H01L 41/0475; H01L 41/1132

USPC .................................................. 73/700–756

See application file for complete search history.

(56) References Cited

U.S. PATENT DOCUMENTS

| | | | | |
|---|---|---|---|---|
| 2015/0183637 | A1* | 7/2015 | Luan | H01L 24/97 257/417 |
| 2015/0197419 | A1* | 7/2015 | Cheng | B81B 7/0006 257/418 |
| 2018/0302727 | A1* | 10/2018 | Deas | H04R 1/245 |

FOREIGN PATENT DOCUMENTS

| | | |
|---|---|---|
| DE | 102010028305 A1 | 8/2011 |
| DE | 102014000243 | 6/2015 |
| DE | 102015212540 A1 | 1/2016 |
| DE | 102016101304 A1 | 8/2016 |
| DE | 102016102092 A1 | 8/2016 |

* cited by examiner

PRESSURE MEASURING ARRANGEMENT INCLUDING TWO PRESSURE MEASUREMENT SENSORS ON A CARRIER

FIELD

Exemplary embodiments are concerned with a pressure measuring arrangement.

BACKGROUND

In safety-relevant applications, sensors are normally provided in redundant fashion. The signal comparison of the sensors is carried out globally in this case. In the case of pressure sensors for side airbags in a vehicle, for example, the measurement values of the pressure sensors incorporated in different doors and/or flaps of the vehicle are compared with one another. Such a comparison can only lead to a reliable result if the pressure present in each case is identical. This is the case for side doors, for example, if the pressure within the door is identical to the surrounding pressure. However, such tests cannot be carried out if the risk of an accident cannot be ruled out, in order to ensure the readiness of the side airbag. Accordingly, such tests can normally be carried out only in the context of a process of starting the vehicle.

SUMMARY

There is thus a need to provide an improved concept for redundant pressure measurement.

The need can be met by the subject matter of the patent claims.

Exemplary embodiments of a pressure measuring arrangement include a first Micro Electro Mechanical System (MEMS) pressure sensor arranged on a carrier, and also a second MEMS pressure sensor arranged on the carrier. Furthermore, the pressure measuring arrangement comprises an integrated circuit arranged on the carrier, the integrated circuit being coupled to the first MEMS pressure sensor and the second MEMS pressure sensor.

BRIEF DESCRIPTION OF THE DRAWINGS

Exemplary embodiments are explained in greater detail below with reference to the accompanying figures, in which.

DETAILED DESCRIPTION

Various exemplary embodiments will now be described more thoroughly with reference to the accompanying drawings, which illustrate some exemplary embodiments. In the figures, the thickness dimensions of lines, layers and/or regions may be illustrated in an exaggerated manner for the sake of clarity.

In the following description of the accompanying figures, which show only a few exemplary embodiments by way of example, identical reference signs may designate identical or comparable components. Furthermore, summarizing reference signs may be used for components and objects which occur multiply in an exemplary embodiment or in a drawing but are described jointly with regard to one or more features. Components or objects which are described with identical or summarizing reference signs may be embodied identically, but if appropriate also differently, with regard to individual, a plurality or all of the features, for example their dimensioning, provided that the description does not explicitly or implicitly reveal something to the contrary.

Although exemplary embodiments may be modified and altered in various ways, exemplary embodiments in the figures are illustrated as examples and are described thoroughly herein. It should be clarified, however, that the intention is not to restrict exemplary embodiments to the forms respectively disclosed, rather that exemplary embodiments are intended to cover all functional and/or structural modifications, equivalents and alternatives which lie within the scope of the invention. Identical reference signs designate identical or similar elements throughout the description of the figures.

It should be noted that one element which is designated as "connected" or "coupled" to another element may be directly connected or coupled to the other element or intervening elements may be present.

The terminology used herein serves only to describe specific exemplary embodiments and is not intended to restrict the exemplary embodiments. As used herein, the singular forms "a", "an" and "the" are also intended to include the plural forms as long as the context does not unambiguously indicate something to the contrary. Furthermore, it should be clarified that the expressions such as e.g. "includes", "including", "comprises" and/or "comprising", as used herein, indicate the presence of stated features, whole numbers, steps, work sequences, elements and/or components, but do not exclude the presence or the addition of one or more features, whole numbers, steps, work sequences, elements, components and/or groups thereof.

Unless defined otherwise, all terms used herein (including technical and scientific terms) have the same meaning as ascribed to them by a person of average skill in the art in the field to which the exemplary embodiments belong. Furthermore, it should be clarified that expressions, e.g. those defined in dictionaries generally used, should be interpreted as if they had the meaning consistent with their meaning in the context of the relevant art, as long as a definition to the contrary is not expressly given herein.

Figure 1:
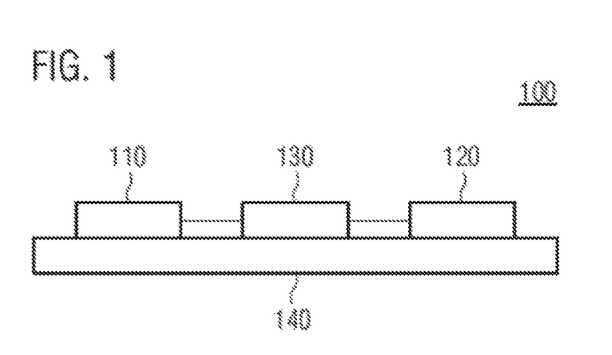
FIG. 1 shows a first exemplary embodiment of a pressure measuring arrangement.

FIG. 1 shows pressure measuring arrangement 100 comprising a first MEMS pressure sensor 110 arranged on a carrier 140, and also a second MEMS pressure sensor 120 arranged on the carrier 140. Furthermore, the pressure measuring arrangement 100 comprises an integrated circuit 130 arranged on the carrier 140, said integrated circuit being coupled to the first MEMS pressure sensor 110 and the second MEMS pressure sensor 120.

The pressure measuring arrangement 100 can enable a redundant pressure measurement by means of the first and second MEMS pressure sensors 110, 120. Since the two MEMS pressure sensors 110, 120 are arranged on the same carrier 140, a pressure measurement at the location of the pressure measuring arrangement can be provided even in the case of failure of one of the MEMS pressure sensors 110, 120. The carrier 140 can be any circuit or component carrier suitable for receiving MEMS components and semiconductor components. By way of example, the carrier 140 can be a leadframe.

By means of the integrated circuit 130 coupled to both MEMS pressure sensors 110, 120, it is possible to analyze the measurement values of the MEMS pressure sensors 110, 120 and thus to ascertain an impairment or damage of one of the MEMS pressure sensors 110, 120.

By way of example, the integrated circuit 130 can be configured to determine whether a measurement value of the first MEMS pressure sensor 110 corresponds to a measurement value of the second MEMS pressure sensor 120 in accordance with a predefined criterion. In this case, the predefined criterion may be e.g. that the measurement value of the first MEMS pressure sensor 110 (within the scope of the error tolerance) is identical to the measurement value of the second MEMS pressure sensor 120. Alternatively, the predefined criterion may be e.g. that a change in the measurement value of the first MEMS pressure sensor 110 (within the scope of the error tolerance) is identical or opposite to a change in the measurement value of the second MEMS pressure sensor 120. In this way the measurement values of the two MEMS pressure sensors 110, 120 can be verified.

If the measurement value of the first MEMS pressure sensor 110 does not correspond to the measurement value of the second MEMS pressure sensor 120, the integrated circuit 130 can furthermore be configured to drive the first MEMS pressure sensor 110 and the second MEMS pressure sensor 120 to carry out a self-test. When carrying out the self-test, the MEMS pressure sensors 110, 120 each carry out a predefined test routine or test procedure in order to test a correct functioning of the MEMS pressure sensor. In other words: the integrated circuit 130 can thus verify whether a defect or damage is present at one of the MEMS pressure sensors 110, 120.

If, on account of the self-test of the MEMS pressure sensors 110, 120, the integrated circuit 130 ascertains that one of the MEMS pressure sensors 110, 120 can no longer supply reliable measurement values (e.g. on account of damage), the integrated circuit 130 can be configured to provide (only) the measurement values of the other of the two MEMS pressure sensors 110, 120 as measurement value of the pressure measuring arrangement at an output (not shown) for an external entity (e.g. a control unit of a vehicle). Furthermore, the integrated circuit 130 can be configured to drive the other of the two MEMS pressure sensors 110, 120 according to a predetermined scheme to carry out a self-test. In this way the integrated circuit 130 can verify whether the other of the two MEMS pressure sensors 110, 120 is still functioning properly. Furthermore, the integrated circuit 130 can also be configured to provide at the output a warning signal for an external entity, comprising information about the loss of the redundancy of the pressure measurement and/or information about the reliability of the measurement values of the MEMS pressure sensors 110, 120 (e.g. that one of the two MEMS pressure sensors 110, 120 has identified an error when carrying out the self-test). In this way it is possible to prevent the external entity from operating with incorrect measurement values.

Alternatively, the pressure measuring arrangement 100 can also provide the measurement values of the two MEMS pressure sensors 110, 120 at the output for the external entity and the external entity (e.g. a control unit or a correspondingly configured processor) carries out the above-described comparison of whether the measurement value of the first MEMS pressure sensor 110 corresponds to the measurement value of the second MEMS pressure sensor 120 in accordance with a predefined criterion. If the measurement value of the first MEMS pressure sensor 110 does not correspond to the measurement value of the second MEMS pressure sensor 120, the external entity can communicate information about that to the integrated circuit 130, such that the integrated circuit 130 can in turn drive the first MEMS pressure sensor 110 and the second MEMS pressure sensor 120 to carry out a self-test.

The first MEMS pressure sensor 110 and the second MEMS pressure sensor 120 can either be embodied structurally identically or be constructed differently. By way of example, the MEMS pressure sensors 110, 120 can have identical or different membrane sizes. Likewise, the MEMS pressure sensors 110, 120 can be based on different measurement principles or the same measurement principle. In this regard, the two MEMS pressure sensors 110, 120 can be configured for capacitive or else piezoresistive pressure measurement.

In the case of the pressure measuring arrangement 100 shown in FIG. 1, the two MEMS pressure sensors 110, 120 and also the integrated circuit 130 are arranged alongside one another on the same surface of the carrier 140. However, the MEMS pressure sensors 110, 120 and also the integrated circuit 130 can alternatively also be arranged on different sides of the carrier 140 or else one on top of another. Various arrangement possibilities are described in greater detail below with reference to FIGS. 2 to 9.

Figure 2:
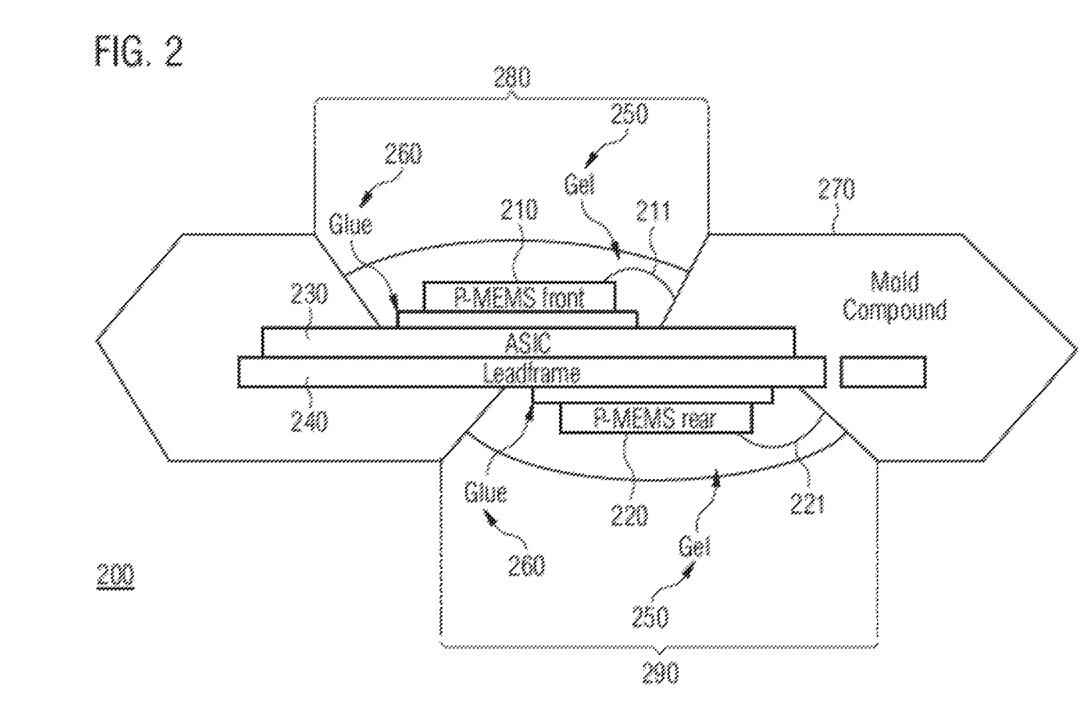
FIG. 2 shows a side view of a second exemplary embodiment of a pressure measuring arrangement.

FIG. 2 shows a further pressure measuring arrangement 200, which in turn comprises a first MEMS pressure sensor 210 arranged on a carrier 240, and a second MEMS pressure sensor 220 arranged on the carrier 240. Furthermore, an integrated circuit 230 (e.g. an application-specific integrated circuit, ASIC), which is coupled to the first MEMS pressure sensor 210 and the second MEMS pressure sensor 220, is arranged on the carrier 240. In this case, the first MEMS pressure sensor 210 is arranged on a first side of the carrier 240 (e.g. a leadframe), and the second MEMS pressure sensor 220 is arranged on an opposite second side of the carrier 240. In the pressure measuring arrangement 200, the integrated circuit 230 is arranged between the first MEMS pressure sensor 210 and the carrier 240.

In this case, the second MEMS pressure sensor 220 is adhesively bonded onto the second side of the carrier 240 (e.g. by means of a soft adhesive 260). The first MEMS pressure sensor 210 is adhesively bonded onto the integrated circuit 230.

The arrangement of the MEMS pressure sensors 210, 220 on different sides of the carrier 240 makes it possible virtually to preclude simultaneous mechanical damage to both MEMS pressure sensors 210, 220. Likewise, a high mechanical decoupling of the two MEMS pressure sensors 210, 220 can be made possible by the integrated circuit 230 and the carrier 240—in particular also by the use of the soft adhesive 260 for securing the MEMS pressure sensors 210, 220.

The pressure measuring arrangement 200 additionally comprises one or more gel layers 250 which at least partly cover(s) the first MEMS pressure sensor 210 and/or the second MEMS pressure sensor 220 and/or a bond wire 211 or 221 coupled respectively to the first MEMS pressure sensor 210 or the second MEMS pressure sensor 220. The gel layer 250 can comprise silicone, for example. The surfaces of the MEMS dies and of the bond wires can be protected by means of the gel.

FIG. 2 furthermore indicates that the carrier 240, the first MEMS pressure sensor 210, the second MEMS pressure sensor 220 and/or the integrated circuit 230 are/is at least partly encapsulated by a potting compound 270. The potting compound 270 is e.g. part of a package encapsulating the further components of the pressure measuring arrangement 200.

By molding of the potting compound 270 or of the package of the pressure measuring arrangement 200, it is possible to form a first pressure inlet 280 and a second pressure inlet 290, which are merely indicated in FIG. 2. Via the first pressure inlet 280, a region in front of the first side of the carrier 240 and thus the first MEMS pressure sensor 210 can be brought into contact with or exposed to a first pressure prevailing at the first pressure inlet 280. Correspondingly, via the second pressure inlet 290, a region in front of the second side of the carrier 240 and thus the second MEMS pressure sensor 220 can be brought into contact with or exposed to a second pressure prevailing at the second pressure inlet 290.

Consequently, the first MEMS pressure sensor 210 is configured to measure the first measuring prevailing at the first pressure inlet 280, while the second MEMS pressure sensor 220 is configured to measure the second pressure prevailing at the second pressure inlet 290. If both pressure inlets 280, 290 are in contact with the same volume, for example, the first and second pressures are substantially identical. Accordingly, both MEMS pressure sensors 210, 220 should output the same measurement values. This can be monitored by means of the integrated circuit 230. Alternatively, the two pressure inlets 280, 290 may also be in contact with different volumes, such that the first pressure may be different than the second pressure. Accordingly, the integrated circuit 230 can measure, from the measurement values of the two MEMS pressure sensors 210, 220, e.g. a pressure difference between the first pressure prevailing at the first pressure inlet 280 and the second pressure prevailing at the second pressure inlet 290.

The pressure measuring arrangement 200 can thus be understood as a multichip package comprising an ASIC and two MEMS cells for pressure measurement. In this case, one MEMS cell is arranged on the ASIC, while the other MEMS cell is arranged on the rear side of the leadframe. As already mentioned above, simultaneous mechanical damage to both MEMS cells can be virtually precluded in this way. Likewise, the ASIC and the leadframe can enable an outstanding mechanical decoupling of the MEMS cells, in particular in combination with the soft adhesive for securing the MEMS dies.

As already noted in association with FIG. 1, any type of MEMS pressure sensor or MEMS cell can be used (e.g. capacitive or piezoresistive). Likewise, the independence of the MEMS pressure sensors or MEMS cells can be improved by the use of diverse (i.e. not structurally identical) MEMS pressure sensors or MEMS cells (having membranes of different sizes, for example).

Like the integrated circuit 130 shown in FIG. 1 as well, the integrated circuit 230 can also be configured to compare the measurement values of the MEMS pressure sensors 210, 220 and, if appropriate, to drive the latter to carry out a self-test. By virtue of the fact that the MEMS pressure sensors 210, 220 can carry out a self-test if necessary, the readiness (availability) of the system can be maintained even in the case of failure of one of the MEMS pressure sensors 210, 220.

Figure 3:
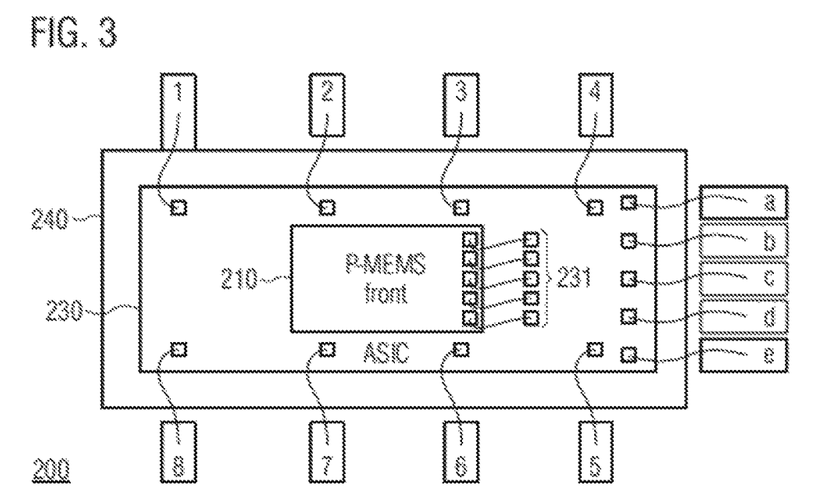
FIGS. 3 and 4 show a front view and a rear view of a third exemplary embodiment of a pressure measuring arrangement.
Figure 4:
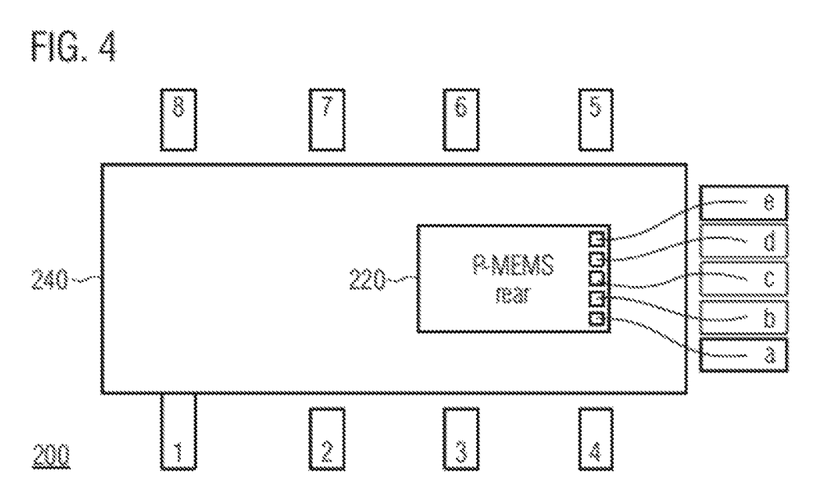

The coupling of the MEMS pressure sensors 210, 220 to the integrated circuit 230 is shown with more details in FIGS. 3 and 4, which show a front view and rear view of the pressure measuring arrangement 200. For reasons of clarity, the gel layer 250, the adhesive 260 and the potting compound 270 are not shown in FIGS. 3 and 4.

FIG. 3 shows a front view of the pressure sensor 200, i.e. a plan view of the first side of the carrier 240, which is configured as a leadframe. The first MEMS pressure sensor 210 is adhesively bonded onto the integrated circuit 230, which is in turn adhesively bonded onto the first side of the carrier 240. The integrated circuit 230 is (electrically) coupled to the first MEMS pressure sensor 210 via a plurality of bond wires 231. Alternatively, the first MEMS pressure sensor 210 and the integrated circuit 230 could also be formed on a common die. The integrated circuit 230 is furthermore coupled to conductive regions or contacts (leads) 1, 2, . . . , 8 of the carrier 240 via a plurality of bond wires. Via the contacts 1, 2, . . . , 8 of the carrier 240, the integrated circuit 230 can be coupled to or communicate with entities outside the pressure measuring arrangement.

Furthermore, the carrier 240 has further conductive regions or contacts a, b, . . . , e. The integrated circuit 230 is conductively coupled to the conductive regions or contacts a, b, . . . , e via at least one first bond wire (here a plurality of bond wires) on the first side of the carrier 240.

Furthermore, FIG. 4, which shows a rear view of the pressure measuring arrangement 200 (i.e. a plan view of the second side of the carrier 240), reveals that the second MEMS pressure sensor 220 is conductively coupled to the conductive regions or contacts a, b, . . . , e of the carrier 240 via at least one second bond wire (here a plurality of bond wires) on the second side of the carrier 240.

Via the conductive regions or contacts a, b, . . . , e of the carrier 240, the second MEMS pressure sensor 220 can be coupled to the integrated circuit 230 on the other side of the carrier 240 with little complexity.

Figure 5:
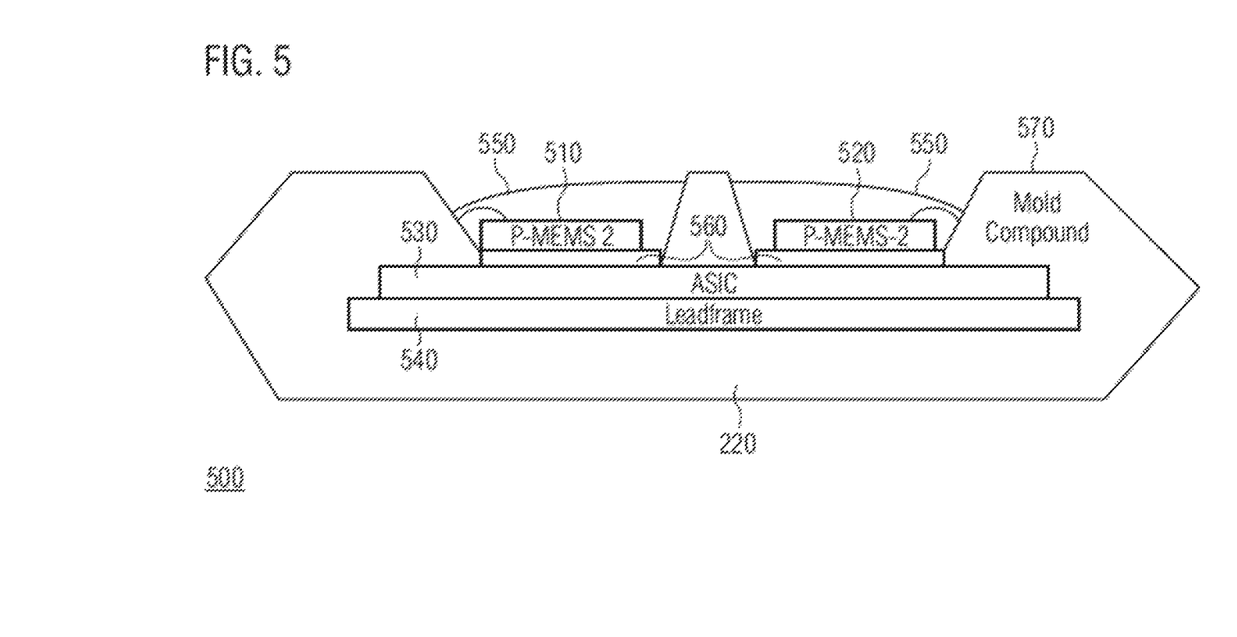
FIGS. 5 and 6 show a side view and front view of a fourth exemplary embodiment of a pressure measuring arrangement.

FIG. 5 furthermore shows an alternative pressure measuring arrangement 500, in which the first MEMS pressure sensor 310 and the second MEMS pressure sensor 520 are arranged on the same side of the carrier 540. In this case, the integrated circuit 530 is arranged between the carrier 540 and both the first MEMS pressure sensor 510 and the second MEMS pressure sensor 520. By way of example, the first MEMS pressure sensor 510 and the second MEMS pressure sensor 520, as shown in FIG. 5, can be adhesively bonded onto the integrated circuit 530 by means of a (soft) adhesive 560. Alternatively, the MEMS pressure sensors 510, 520 and the integrated circuit 530 could also be formed on a common die.

In this case, the integrated circuit 530 has the properties and capabilities already described above in association with the integrated circuits 130 and 230. Furthermore, components of the pressure measuring arrangement 500 can in turn be at least partly encapsulated by a potting compound 570. Likewise, the MEMS pressure sensors 510, 520 and also bond wires coupled thereto can be at least partly covered by a gel layer 550. For details regarding the gel layer 550 the encapsulation with the potting compound 570, reference is made to the explanations above.

In FIG. 5, both MEMS pressure sensors 510, 520 are arranged on the first side (front side) of the carrier 540. It goes without saying, however, that the two MEMS pressure sensors 510, 520 can be arranged on the second side (rear side) of the carrier 540.

Figure 6:
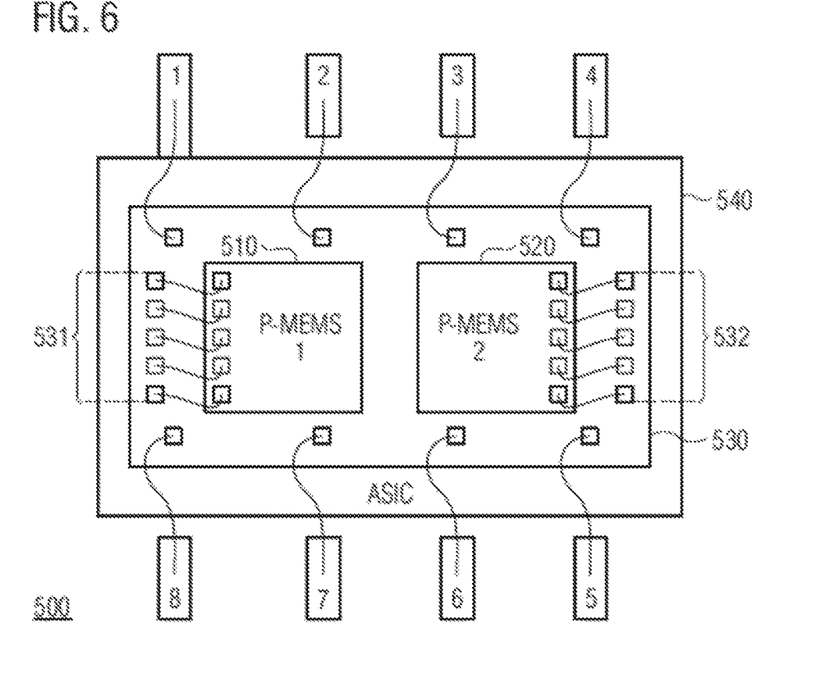

FIG. 6 furthermore also shows a front view of the pressure measuring arrangement 500, i.e. a plan view of the first side of the carrier 540, in order to illustrate the coupling of the integrated circuit 530 to the MEMS pressure sensors 510, 520. For reasons of clarity, the gel layer 550, the adhesive 560 and the potting compound 570 are not shown in FIG. 6.

The integrated circuit 530 is (electrically) coupled to the first MEMS pressure sensor 510 via a first plurality of bond wires 531. Furthermore, the integrated circuit 530 is (electrically) coupled to the second MEMS pressure sensor 520 via a second plurality of bond wires 532. The integrated circuit 530 is furthermore coupled to conductive regions or contacts 1, 2, . . . , 8 of the carrier 540 via a plurality of bond wires. Via the contacts 1, 2, . . . , 8 of the carrier 540, the integrated circuit 530 can be coupled or communicate with entities outside the pressure measuring arrangement.

The pressure measuring arrangement 500 carrying both MEMS cells on the chip surface (i.e. the integrated circuit 530) may have a reduced independence of the two MEMS pressure sensors 510, 520 vis-à-vis mechanical damage in comparison with the pressure measuring arrangements 100 and 200, but the pressure measuring arrangement 500 can be produced more cost-effectively (e.g. the package or the assembly can be more favorable).

Figure 7:
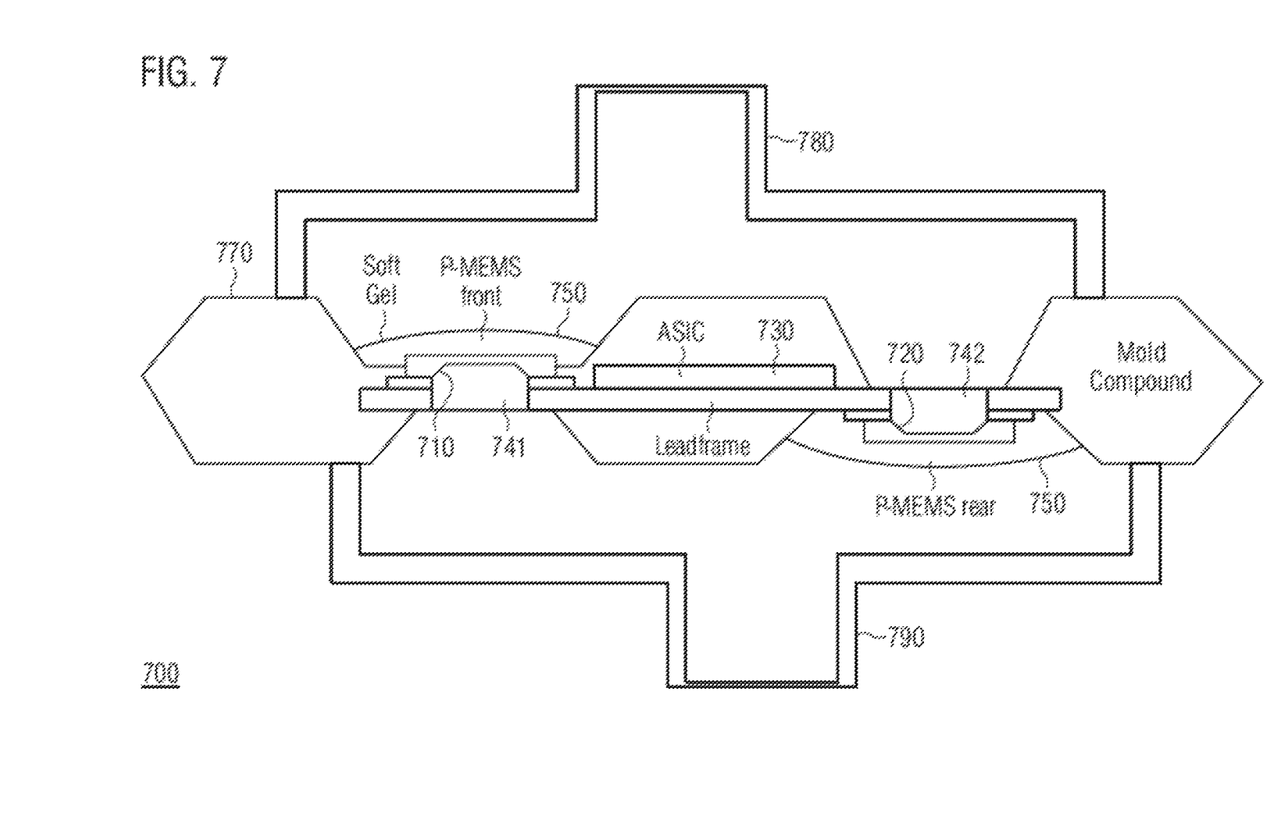
FIGS. 7, 8, and 9 show a side view, front view, and rear view of a fifth exemplary embodiment of a pressure measuring arrangement, respectively.

A further exemplary embodiment of a pressure measuring arrangement 700 comprising differential pressure sensor cells that are respectively in contact with a first pressure inlet on the front side and a second pressure inlet on the rear side of the die is shown in FIG. 7.

The pressure measuring arrangement 700 comprises a first MEMS pressure sensor 710 arranged on a first side (front side) of the carrier 740, and a second MEMS pressure sensor arranged on an opposite second side (rear side) of the carrier 740. As shown in FIG. 7, the first MEMS pressure sensor 710 can be adhesively bonded onto the first side of the carrier 740 for example by means of a (soft) adhesive 760. Likewise, the second MEMS pressure sensor 720 can be adhesively bonded onto the second side of the carrier 740 by means of the adhesive 760. Alternatively, the MEMS pressure sensors 710, 720 can also be secured to the carrier 740 by means of any other suitable method. In this case, the first MEMS pressure sensor 710 is arranged partly above a first cutout 741 in the carrier 740, while the second MEMS pressure sensor 720 is arranged partly above a second cutout 742 in the carrier 740. As already described in association with the previous exemplary embodiments, the MEMS pressure sensors 710, 720 and also bond wires coupled thereto can be at least partly covered by a gel layer 750.

Figure 8:
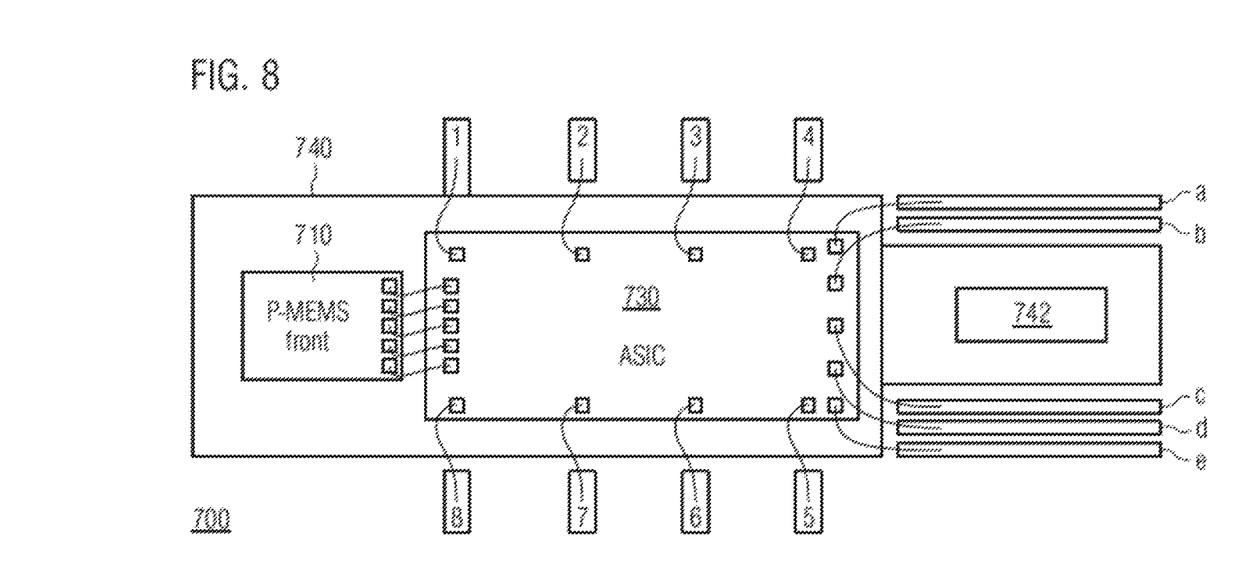
Figure 9:
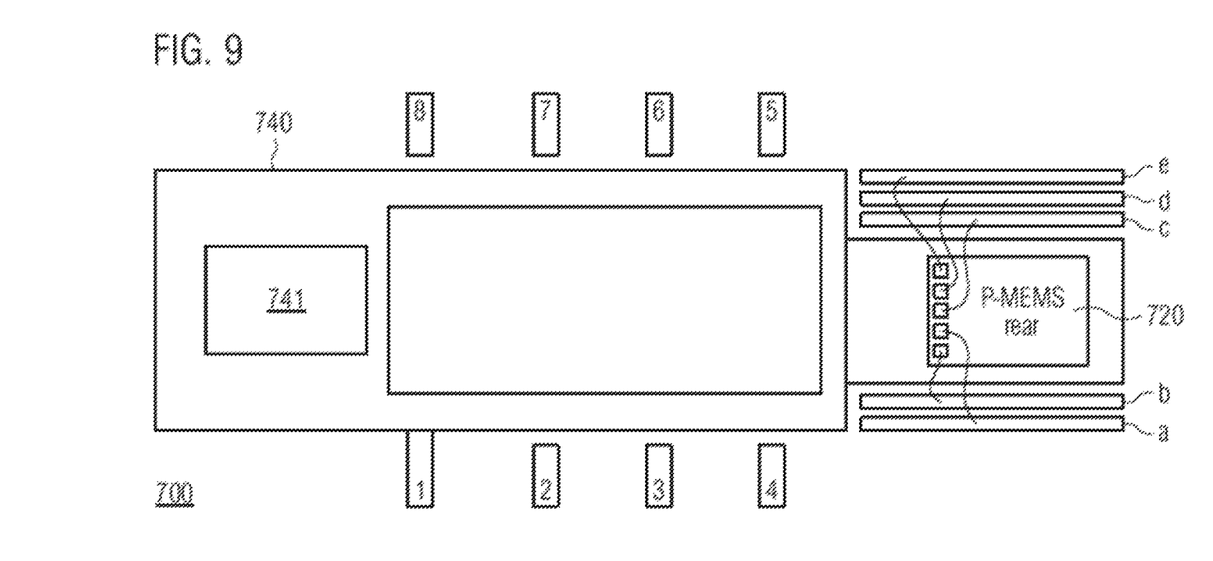

The coupling of the MEMS pressure sensors 710, 720 to the integrated circuit 730 is shown with more details in FIGS. 8 and 9, which show a front view and rear view of the pressure measuring arrangement 700. For reasons of clarity, the gel layer 750, the adhesive 760 and the potting compound 770 are not shown in FIGS. 8 and 9. Furthermore, for reasons of clarity in FIGS. 8 and 9 only the cutouts 742 and 741 respectively are depicted, but not the MEMS pressure sensors 720 and 710 respectively situated on the opposite side of the carrier 740.

FIG. 8 shows a front view of the pressure sensor 700, i.e. a plan view of the first side of the carrier 740, which is formed as a leadframe. The first MEMS pressure sensor 710 is adhesively bonded onto the first side of the carrier 740. The integrated circuit 730 is (electrically) coupled to the first MEMS pressure sensor 710 via a plurality of bond wires. The integrated circuit 730 is furthermore coupled to conductive regions or contacts 1, 2, . . . , 8 of the carrier 740 via a plurality of bond wires. Via the contacts 1, 2, . . . , 8 of the carrier 740, the integrated circuit 730 can be coupled to or communicate with entities outside the pressure measuring arrangement.

Furthermore, the carrier 740 has further conductive regions or contacts a, b, . . . , e. The integrated circuit 730 is conductively coupled to the conductive regions or contacts a, b, . . . , e via at least one first bond wire (here a plurality of bond wires) on the first side of the carrier 740.

Furthermore, FIG. 9, which shows a rear view of the pressure measuring arrangement 700 (i.e. a plan view of the second side of the carrier 740), reveals that the second MEMS pressure sensor 720 is conductively coupled to the conductive regions or contacts a, b, . . . , e of the carrier 740 via at least one second bond wire (here a plurality of bond wires) on the second side of the carrier 740.

Via the conductive regions or contacts a, b, . . . , e of the carrier 740, the second MEMS pressure sensor 720 can be coupled to the integrated circuit 730 on the other side of the carrier 740 with little complexity.

Furthermore, the pressure measuring arrangement 700 shown in FIG. 7 comprises a first pressure inlet 780 and a second pressure inlet 790. The pressure inlets 780, 790 are formed in a package of the pressure measuring arrangement 700, which package can be formed for example by the potting compound 770.

Via the first pressure inlet 780, a region in front of the first side of the carrier 740 can be brought into contact with a first pressure prevailing at the first pressure inlet 780. Correspondingly, via the second pressure inlet 790, a region in front of the second side of the carrier 740 can be brought into contact with a second pressure prevailing at the second pressure inlet 790. On account of the cutouts 741, 742, the MEMS pressure sensors 710, 720 are thus subjected both to the first pressure and to the second pressure. The first MEMS pressure sensor 710 and the second MEMS pressure sensor 720 are thus each configured to measure a pressure difference between the first pressure prevailing at the first pressure inlet 780 and the second pressure prevailing at the second pressure inlet 790.

Furthermore, the pressure measuring arrangement 700 also comprises an integrated circuit 730 arranged on the carrier 740, said integrated circuit being coupled to the first MEMS pressure sensor 710 and the second MEMS pressure sensor 720. By means of the integrated circuit 730 it is possible to in turn carry out a analysis of the measurement values of the MEMS pressure sensors 710, 720 and thus to ascertain an impairment or damage of one of the MEMS pressure sensors 710, 720.

By way of example, the integrated circuit 730 can be configured to determine whether a measurement value of the first MEMS pressure sensor 710 corresponds to a measurement value of the second MEMS pressure sensor 720 in accordance with a predefined criterion. In this case, the predefined criterion may be e.g. that the measurement value of the first MEMS pressure sensor 710 (within the scope of the error tolerance) is identical to the measurement value of the second MEMS pressure sensor 720. Alternatively, the predefined criterion may be e.g. that a change in the measurement value of the first MEMS pressure sensor 710 (within the scope of the error tolerance) is opposite to a change in the measurement value of the second MEMS pressure sensor 720. In this way the measurement values of the two MEMS pressure sensors 710, 720 can be verified.

If the measurement value of the first MEMS pressure sensor 710 does not correspond to the measurement value of the second MEMS pressure sensor 720, the integrated circuit 730 can furthermore be configured to drive the first MEMS pressure sensor 710 and the second MEMS pressure sensor 720 to carry out a self-test. The integrated circuit 730 can thus verify whether a defect or damage is present at one of the MEMS pressure sensors 710, 720.

If, on account of the self-test of the MEMS pressure sensors 710, 720, the integrated circuit 730 ascertains that one of the MEMS pressure sensors 710, 720 can no longer supply reliable measurement values (e.g. on account of damage), the integrated circuit 730 can be configured to provide the measurement values of the other of the two MEMS pressure sensors 710, 720 as measurement value of the pressure measuring arrangement at an output (not shown) for external entities (e.g. a control unit of a vehicle). Furthermore, the integrated circuit 730 can be configured to drive the other of the two MEMS pressure sensors 710, 720 according to a predetermined scheme to carry out a self-test. In this way the integrated circuit 730 can verify whether the other of the two MEMS pressure sensors 710, 720 is still functioning properly.

Figure 10:
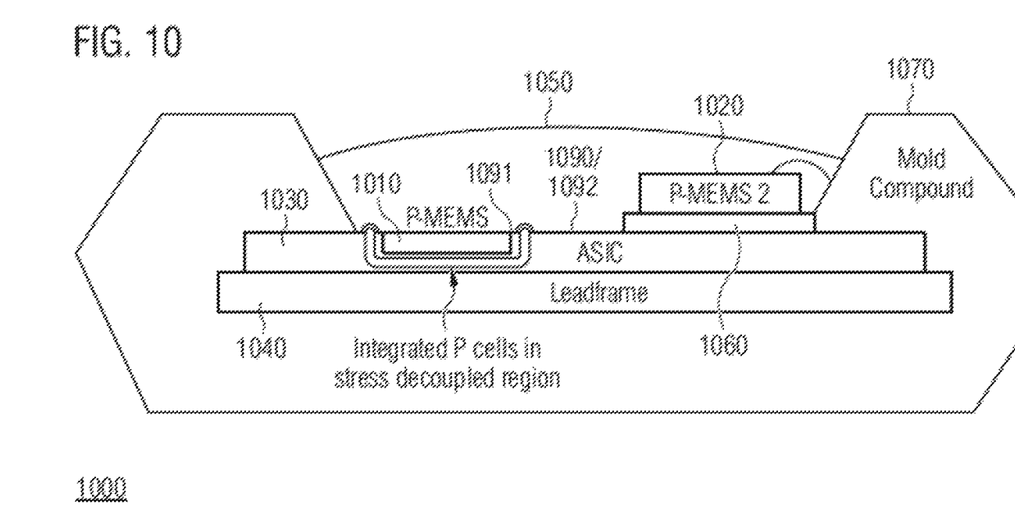
FIGS. 10 and 11 show a side view and front view of a sixth exemplary embodiment of a pressure measuring arrangement.

FIG. 10 shows yet another pressure measuring arrangement 1000, in which the first MEMS pressure sensor 1010 and the second MEMS pressure sensor 1020 are arranged on the same side of the carrier 1040. In this case, the first MEMS pressure sensor 1010 and the integrated circuit 1030 are formed on a common die 1090. The second MEMS pressure sensor 1020 is adhesively bonded onto the integrated circuit 1030 or the die 1090 by means of a (soft) adhesive 1060.

In this case, the first MEMS pressure sensor 1010 is arranged in a first region 1091 of the die 1090. The first region 1091 of the die 1090 is stress-decoupled from a second region 1092 of the die 1090, in which the integrated circuit 1030 is formed. In other words: the first region 1091 of the die 1090 is mechanically decoupled from the second region 1092 of the die 1090. The first region 1091 can be e.g. an "island" composed of silicon, in which the first MEMS pressure sensor 1010 is formed and which is suspended from the second region 1092 of the die 1090 via a resilient (semiconductor) structure.

The two MEMS pressure sensors 1010, 1020 of the pressure measuring arrangement 1000 are produced by means of different processes, that is to say that they are implemented in diverse ways. Accordingly, it is possible to reduce the susceptibility of the pressure measuring arrangement 1000 vis-à-vis systematic faults in the production processes for the two MEMS pressure sensors 1010, 1020.

In this case, the integrated circuit 1030 has the properties and capabilities already described above in association with the integrated circuits 130 and 230. Furthermore, components of the pressure measuring arrangement 1000 can in turn be at least partly encapsulated by a potting compound 1070. Likewise, the MEMS pressure sensors 1010, 1020 and also bond wires coupled thereto can be at least partly covered by a gel layer 1050. For details regarding the gel layer 1050 of the encapsulation with the potting compound 1070, reference is made to the explanations above.

Figure 11:
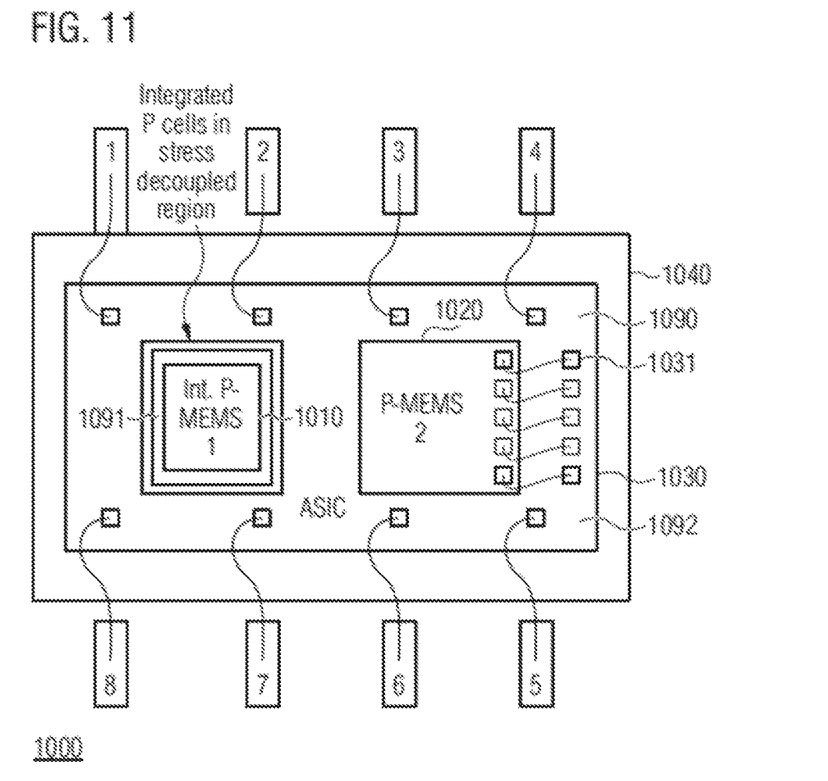

FIG. 11 furthermore also shows a front view of the pressure measuring arrangement 1000, i.e. a plan view of the first side of the carrier 1040, in order to illustrate the embedding of the first MEMS pressure sensor 1010 and of the integrated circuit 1030 into the common die 1090 and also the coupling of the integrated circuit 1030 to the second MEMS pressure sensor 1020. For reasons of clarity, the gel layer 1050, the adhesive 1060 and the potting compound 1070 are not shown in FIG. 11.

The first MEMS pressure sensor 1010 is formed in the region 1091 that is stress-decoupled from the rest of the die 1090. The MEMS pressure sensor 1010 is (electrically) coupled to the integrated circuit 1030 via the die 1090.

The integrated circuit 1030 formed in the second region 1092 of the die 1090 is (electrically) coupled to the second MEMS pressure sensor 1020 via a plurality of bond wires 1031. The integrated circuit 1030 is furthermore coupled to conductive regions or contacts 1, 2, . . . , 8 of the carrier 1040 via a plurality of bond wires. Via the contacts 1, 2, . . . , 8 of the carrier 1040, the integrated circuit 1030 can be coupled to or communicate with entities outside the pressure measuring arrangement.

Alternatively, the second MEMS pressure sensor 1020 can also be arranged on the second side of the carrier 1040 (e.g. adhesively bonded onto the second side of the carrier 1040 by means of the (soft) adhesive 1060). The arrangement of the MEMS pressure sensors 1010, 1020 on different sides of the carrier 1040 makes it possible to reduce the risk of simultaneous (mechanical) damage to both MEMS pressure sensors 1010, 1020.

The pressure measuring arrangements 100, 200, 500, 700 and 1000 described above can be understood as exemplary embodiments of a two-channel pressure measuring architecture which can enable a totally redundant pressure measurement.

The features disclosed in the description above, the following claims and the accompanying figures may be of importance and implemented individually and also in any desired combination for the realization of an exemplary embodiment in their various configurations.

The exemplary embodiments described above merely represent an illustration of the principles of the present invention. It goes without saying that modifications and variations of the arrangements and details described herein will become apparent to others skilled in the art. Therefore, the intention is for the invention to be restricted only by the scope of protection of the following patent claims and not by the specific details that have been presented herein with reference to the description and the explanation of the exemplary embodiments.

What is claimed is:

1. A pressure measuring arrangement, comprising:
a first MEMS pressure sensor arranged on a carrier;
a second MEMS pressure sensor arranged on the carrier; and
an integrated circuit arranged on the carrier, the integrated circuit being coupled to the first MEMS pressure sensor and the second MEMS pressure sensor,
wherein the first MEMS pressure sensor is arranged on a first surface of the carrier, and wherein the second MEMS pressure sensor is arranged on a second surface of the carrier, the second surface being opposite to the first surface such that the carrier is arranged between the first MEMS pressure sensor and the second MEMS pressure sensor, wherein the first surface and the second surface define a thickness of the carrier.

2. The pressure measuring arrangement as claimed in claim 1, wherein the second MEMS pressure sensor is adhesively bonded onto the second surface of the carrier.

3. The pressure measuring arrangement as claimed in claim 1, wherein the first MEMS pressure sensor is adhesively bonded onto the first surface of the carrier.

4. The pressure measuring arrangement as claimed in claim 1, wherein the integrated circuit is arranged on the first surface of the carrier between the first MEMS pressure sensor and the carrier.

5. The pressure measuring arrangement as claimed in claim 4, wherein the first MEMS pressure sensor is adhesively bonded onto the integrated circuit.

6. The pressure measuring arrangement as claimed in claim 1, wherein the first MEMS pressure sensor and the integrated circuit are formed on a common die.

7. The pressure measuring arrangement as claimed in claim 1, further comprising:
 a first pressure inlet located over the first surface such that a first pressure prevailing at the first pressure inlet is applied towards the first surface in a first direction; and
 a second pressure inlet located over the second surface a such that a second pressure prevailing at the second pressure inlet is applied towards the second surface in a second direction that is anti-parallel to the first direction,
 wherein the first MEMS pressure sensor is configured to measure the first pressure prevailing at the first pressure inlet, and
 wherein the second MEMS pressure sensor is configured to measure the second pressure prevailing at the second pressure inlet.

8. The pressure measuring arrangement as claimed in claim 1, further comprising:
 a first pressure inlet located over the first surface such that a first pressure prevailing at the first pressure inlet is applied towards the first surface in a first direction; and
 a second pressure inlet located over the second surface a such that a second pressure prevailing at the second pressure inlet is applied towards the second surface in a second direction that is anti-parallel to the first direction,
 wherein the first MEMS pressure sensor is subjected to both the first pressure prevailing at the first pressure inlet and the second pressure prevailing at the second pressure inlet and is configured to measure a first pressure difference between the first pressure prevailing at the first pressure inlet and the second pressure prevailing at the second pressure inlet, and
 the second MEMS pressure sensor is subjected to both the first pressure prevailing at the first pressure inlet and the second pressure prevailing at the second pressure inlet and is configured to measure a second pressure difference between the first pressure prevailing at the first pressure inlet and the second pressure prevailing at the second pressure inlet.

9. The pressure measuring arrangement as claimed in claim 1, wherein:
 the carrier has at least one conductive region,
 the integrated circuit is conductively coupled to the at least one conductive region via at least one first bond wire on the first surface of the carrier, and
 the second MEMS pressure sensor is conductively coupled to the at least one conductive region via at least one second bond wire on the second surface of the carrier.

10. A pressure measuring arrangement, comprising:
 a first MEMS pressure sensor arranged on a carrier;
 a second MEMS pressure sensor arranged on the carrier; and
 an integrated circuit arranged on the carrier, the integrated circuit being coupled to the first MEMS pressure sensor and the second MEMS pressure sensor,
 wherein the first MEMS pressure sensor and the second MEMS pressure sensor are arranged on a main surface of the carrier,
 wherein the integrated circuit is arranged on the main surface of the carrier, and
 wherein the integrated circuit extends along the main surface of the carrier such that a first part of the integrated circuit is interposed between the main surface of the carrier and the first MEMS pressure sensor and a second part of the integrated circuit is interposed between the main surface of the carrier and the second MEMS pressure sensor.

11. The pressure measuring arrangement as claimed in claim 10, wherein the first MEMS pressure sensor and the second MEMS pressure sensor are adhesively bonded onto a same surface of the integrated circuit.

12. A pressure measuring arrangement, comprising:
 a carrier;
 a common die arranged on the carrier;
 a first MEMS pressure sensor integrated within the common die;
 a second MEMS pressure sensor arranged on a surface of the common die such that the common die is interposed between the second MEMS pressure sensor and the carrier; and
 an integrated circuit that is integrated within the common die, the integrated circuit being coupled to the first MEMS pressure sensor and to the second MEMS pressure sensor,
 wherein the common die and the second MEMS pressure sensor are arranged on a main surface of the carrier, and
 the second MEMS pressure sensor is adhesively bonded onto the integrated circuit.

13. The pressure measuring arrangement as claimed in claim 12, wherein the first MEMS pressure sensor is arranged in a first region of the common die, which is stress-decoupled from a second region of the common die, and wherein the integrated circuit is formed in the second region of the common die.

14. The pressure measuring arrangement as claimed in claim 1, wherein the carrier is a leadframe.

15. The pressure measuring arrangement as claimed in claim 1, further comprising:
 a gel layer which at least partly covers at least one of the first MEMS pressure sensor, the second MEMS pressure sensor, and a bond wire coupled to the first MEMS pressure sensor or the second MEMS pressure sensor.

16. The pressure measuring arrangement as claimed in any of claim 1, wherein at least one of the carrier, the first MEMS pressure sensor, the second MEMS pressure sensor, and the integrated circuit is at least partly encapsulated by a potting compound.

17. A pressure measuring arrangement, comprising:
 a first MEMS pressure sensor arranged on a carrier;
 a second MEMS pressure sensor arranged on the carrier; and
 an integrated circuit arranged on the carrier, the integrated circuit being coupled to the first MEMS pressure sensor and the second MEMS pressure sensor,
 wherein the integrated circuit is configured to determine whether a measurement value of the first MEMS pressure sensor corresponds to a measurement value of the second MEMS pressure sensor in accordance with a predefined criterion.

18. The pressure measuring arrangement as claimed in claim 17, wherein, if the measurement value of the first MEMS pressure sensor does not correspond to the measurement value of the second MEMS pressure sensor, the integrated circuit is configured to drive the first MEMS pressure sensor and the second MEMS pressure sensor to carry out a self-test.

19. The pressure measuring arrangement as claimed in claim 1, wherein the first MEMS pressure sensor and the second MEMS pressure sensor are structurally identical.

20. The pressure measuring arrangement as claimed in claim 1, wherein the first MEMS pressure sensor and the second MEMS pressure sensor are constructed differently.

21. The pressure measuring arrangement as claimed in claim 17, wherein the integrated circuit is configured to determine whether a magnitude of the measurement value of the first MEMS pressure sensor is within a predetermined error margin from a magnitude of the measurement value of the second MEMS pressure sensor and detect an error on a condition that the magnitude of the measurement value of the first MEMS pressure sensor is outside the predetermined error margin from the magnitude of the measurement value of the second MEMS pressure sensor.

* * * * *